United States Patent

Ghidini et al.

Patent Number: 6,114,203
Date of Patent: Sep. 5, 2000

[54] METHOD OF MANUFACTURING A MOS INTEGRATED CIRCUIT HAVING COMPONENTS WITH DIFFERENT DIELECTRICS

[75] Inventors: Gabriella Ghidini, Milan; Cesare Clementi, Busto Arsizio, both of Italy

[73] Assignee: STMicroelectronics S.r.l., Agrate Brianza, Italy

[21] Appl. No.: 08/644,892

[22] Filed: May 10, 1996

[30] Foreign Application Priority Data

May 10, 1995 [EP] European Pat. Off. ............. 95830189

[51] Int. Cl.[7] .................................................. H01L 21/336
[52] U.S. Cl. .......................... 438/258; 438/201; 438/264; 438/287; 438/275
[58] Field of Search ..................................... 438/201, 217, 438/275, 258, 231, 287, 232, 264, 591, FOR 168

[56] References Cited

U.S. PATENT DOCUMENTS

| | | | |
|---|---|---|---|
| 4,780,424 | 10/1988 | Holler et al. | 438/263 |
| 4,833,096 | 5/1989 | Huang et al. | 438/201 |
| 4,859,619 | 8/1989 | Wu et al. | 438/201 |
| 5,254,489 | 10/1993 | Nakata | 438/275 |
| 5,393,683 | 2/1995 | Mathews et al. | 438/591 |
| 5,432,114 | 7/1995 | O | 438/217 |
| 5,502,009 | 3/1996 | Lin | 438/275 |
| 5,550,078 | 8/1996 | Sung | 438/210 |
| 5,576,226 | 11/1996 | Hwang | 438/275 |

FOREIGN PATENT DOCUMENTS

| | | |
|---|---|---|
| 0 085 551 | 8/1983 | European Pat. Off. . |
| 0 154 670 | 9/1985 | European Pat. Off. . |
| 0 395 084 | 10/1990 | European Pat. Off. . |
| 1-89457 | 4/1989 | Japan . |

OTHER PUBLICATIONS

Ma, Zhi–Jian et al., "Optimization of Gate Oxide $N_2O$ Anneal for CMOSFET's at Room and Cryogenic Temperatures", *IEEE*, vol. 4, No. 8: 1364–1371, Aug. 1994.

*Primary Examiner*—Carl Whitehead, Jr.
*Assistant Examiner*—Khanh Duong
*Attorney, Agent, or Firm*—Theodore E. Galanthay; E. Russell Tarleton; Seed IP Law Group PLLC

[57] ABSTRACT

The method described provides for the formation of thin thermal oxide on areas of a silicon die intended for memory cells and other components of the peripheral circuits of the memory. To improve the quality of the oxide of the cells essentially in terms of resistance to degradation due to the passage of charges through it during the operation of the memory, the method provides for a step for the high-temperature nitriding of the oxide. According to a variant, the nitrided oxide formed on the areas intended for the components of the peripheral circuits is removed and then formed again by a similar thermal oxidation treatment followed by high-temperature nitriding.

12 Claims, 6 Drawing Sheets

METHOD OF MANUFACTURING A MOS INTEGRATED CIRCUIT HAVING COMPONENTS WITH DIFFERENT DIELECTRICS

TECHNICAL FIELD

The present invention relates to a method of manufacturing an integrated circuit on a monocrystalline silicon die, the method providing for the formation of silicon dioxide on areas intended for components of a first type and on areas intended for components of a second type by high-temperature treatment in an oxidizing atmosphere.

BACKGROUND OF THE INVENTION

A typical example of an integrated circuit with components of two somewhat different types is a non-volatile memory (an EPROM, an EEPROM or a "flash" memory) with the respective control circuits, that is, the reading, writing and, in the case of "flash" memories and EEPROMs, erasing circuits.

As is known, the cells of a non-volatile memory comprise, in their structures, a "floating" gate electrode separated from the silicon surface by a dielectric. The floating gate electrode is usually constituted by a thin, doped polycrystalline element and the dielectric is a thin layer (6–35 nm) of silicon dioxide produced by oxidation of the silicon at high temperature (thermal oxide).

The control circuits of a matrix of memory cells and the other data-processing circuits, generally known as peripheral circuits, which may be integrated with the memory on the same silicon die, contain components, such as MOSFET transistors and capacitors, which have structural elements similar to those of the memory cells.

In particular, the bodies of the transistors and one electrode of each capacitor of the peripheral circuits are constituted by the silicon substrate, the gate electrodes of the transistors and the other electrode of each capacitor being constituted by an electrically-conductive element of metal or doped polycrystalline silicon.

Although the components of the first type, that is, the memory cells, and the components of the second type, that is, the transistors and the capacitors of the peripheral circuits, are structurally similar, it is not always possible or convenient to produce them by exactly the same operations. In particular, the thermal oxide used as the dielectric in the memory cells and in the peripheral circuits has to have different characteristics according to the function it performs in the two types of components. In fact, whereas in the transistors and in the capacitors of the peripheral circuits maximum electrical insulation between the electrodes separated by the dielectric is of essential importance, in the cells it is important for the oxide to be able to withstand movements of electrical charges within it, without deterioration, during the processes which occur during writing and during any erasure from the cells. Rapid degradation of the thermal oxide in the end results in a shorter operative life of the memory.

SUMMARY OF THE INVENTION

The general purpose of the present invention is to propose a process of the type defined at the beginning which can produce dielectrics of different qualities for the two different types of component of the integrated circuit.

A particular object of the invention is to provide an integrated circuit comprising a memory and peripheral circuits in which both the memory cells and the peripheral circuits have longer operative lives than those of conventional devices.

In accordance with one aspect of the present invention, a method is provided for manufacturing an integrated circuit having first and second types of circuit components formed on a monocrystalline silicon substrate, where the first type of components are formed on a first section of the substrate and the second type of components are formed on a second section of the substrate. Both the first and second sections of the substrate are then exposed to an oxidizing atmosphere for a time sufficient to form an oxide layer on the substrate. The oxide layer is then exposed to a nitriding atmosphere to form a dielectric layer having a desired thickness. A layer of conductive material is then formed on the dielectric layer.

In another aspect of the invention, before being exposed to the nitride atmosphere, the oxide layer is removed from the first section of the substrate. The substrate is then exposed first to an oxidizing atmosphere and then to a nitriding atmosphere until an oxide layer of the desired thickness is formed on the first section of the substrate.

BRIEF DESCRIPTION OF THE DRAWINGS

The invention and the advantages resulting therefrom will be explained further by the following drawings and descriptions of some embodiments thereof, given by way of non-limiting example.

DETAILED DESCRIPTION OF THE INVENTION

The method according to the invention can advantageously be put into practice to produce various types of integrated circuit with memories which may even differ greatly from one another structurally. The steps which distinguish them, however, are essentially the same for any type of integrated circuit.

Figure 1:
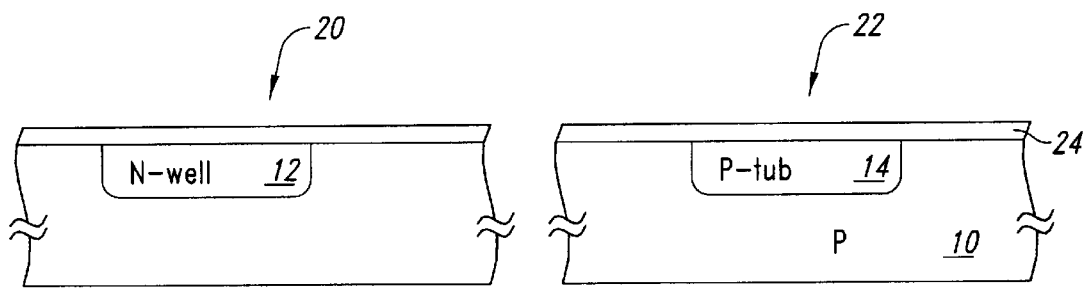
FIGS. 1 and 2 illustrate a method for forming an integrated device according to a first embodiment of the invention.
Figure 2:
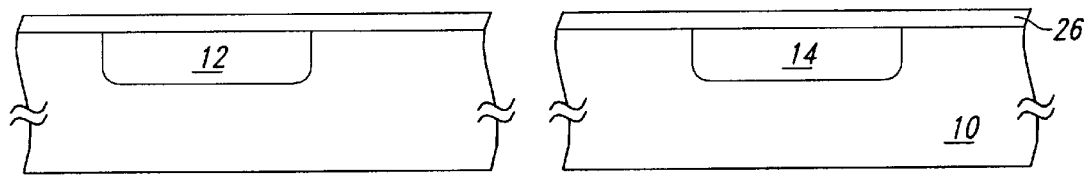

FIGS. 1 and 2 illustrate one embodiment of the inventive method for forming an integrated device having a substrate 10, memory cells formed in a first region 12 of a first area or section 20 of the substrate 10, and peripheral circuits, such as transistors, formed in a second region 14 of a second section 22 of the substrate 10. The substrate 10 is first subjected to a normal high-temperature (750–950° C.) oxidation treatment in an oven at atmospheric pressure in an oxidizing atmosphere ($O_2HCl/H_2O$ or $O_2/N_2$) for a time sufficient to form a layer 24 of silicon dioxide ($SIO_2$) on the exposed areas of the substrate 10. After the oxidizing treatment, the layer 24 is exposed to a nitriding treatment, at a temperature (750–1050° C.) that may be equal to or slightly greater than the oxidation temperature, in a nitrous oxide ($N_2O$) atmosphere at atmospheric pressure for a period of time between 5 and 60 minutes to produce a dielectric layer 26 of the desired thickness. In one aspect of the invention, the desired thickness is in the range of approximately 6–35 nanometers (nm).

Still referring to FIGS. 1 and 2, the silicon dioxide layer 24 may remain on both of the sections 20 and 22 or may be removed from one of these areas before the nitriding treatment and then reformed by a subsequent oxidation treatment. In this embodiment, the remainder of the integrated circuit is formed according to conventional processing techniques. One advantage of this method is that memory cells formed therefrom have considerably longer lives than memory cells that include a dielectric layer formed from a layer of silicon dioxide that is produced in a conventional manner.

Figure 3:
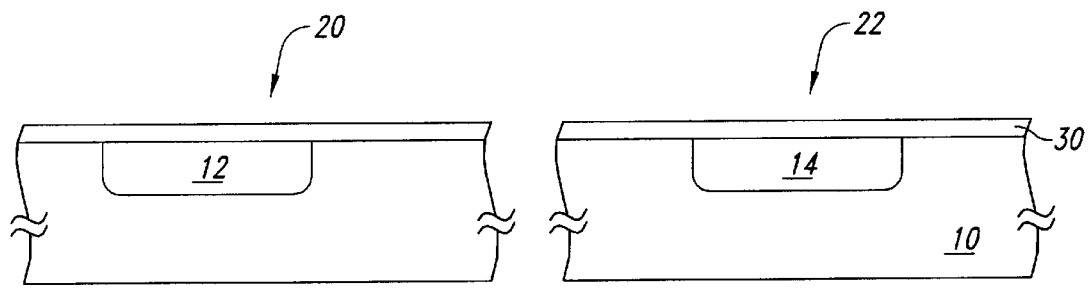
FIGS. 3–5 illustrate a method for forming an integrated device according to a second embodiment of the invention.
Figure 4:
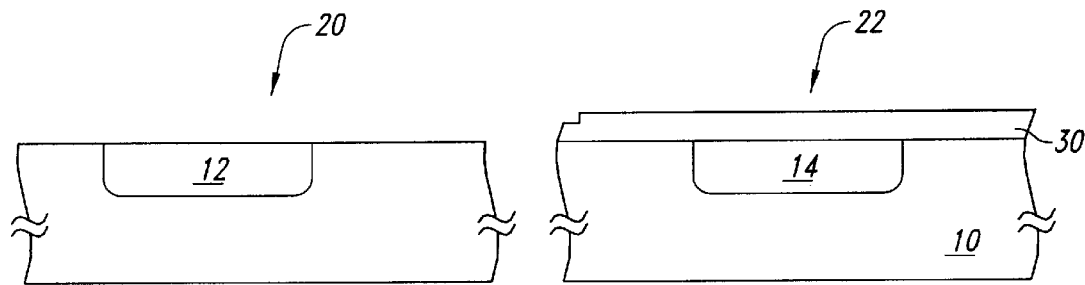
Figure 5:
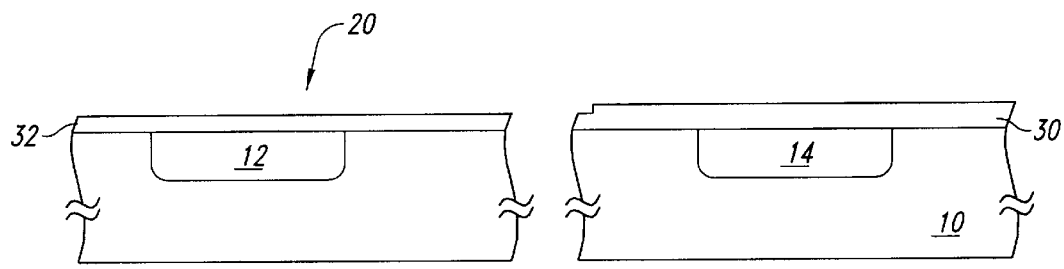

FIGS. 3–5 illustrate a process for forming an integrated circuit according to a second embodiment of the invention. Referring to FIG. 3, a silicon substrate 10, which in one embodiment of the invention is doped p-type, is first subjected to a conventional high-temperature oxidation step, such as that described above in conjunction with FIGS. 1–2, until a layer 30 of silicon dioxide having a thickness (for example, 6–35 nm) less than that (for example, 10–40 nm) desired for the peripheral components, such as transistors, has been formed on both the sections 20 and 22 of the substrate 10.

Referring to FIG. 4, this layer 30 is then removed, for example, by conventional chemical etching in a solution of hydrofluoric acid (HF), from the areas 20 in which the memory cells will be formed, so as to expose the underlying substrate 10.

Referring to FIG. 5, the substrate 10 and the remaining portion of the layer 30 are then subjected to a second conventional high-temperature oxidation step and then to a nitriding treatment such as that described above in conjunction with FIGS. 1 and 2, until a layer 32 of silicon dioxide having a thickness suitable to form the dielectrics of the memory cells is formed on the section 20 of the substrate 10. After this second oxidation and nitriding step, the thickness of the layer 30 of silicon dioxide on the section 22 of the substrate 10 is increased to a desired thickness that is greater than the thickness of the layer 32. Thus, one can achieve oxide layers 30 and 32 of different desired thicknesses that can be precisely determined by suitable calibration of the process parameters during the first and second oxidation steps.

Referring to FIGS. 1–5, the described processing methods produce, for the peripheral components in the section 22, a dielectric 30 that differs markedly from the conventionally preferred dielectric, which is formed from non-nitrided silicon dioxide.

Figure 6:
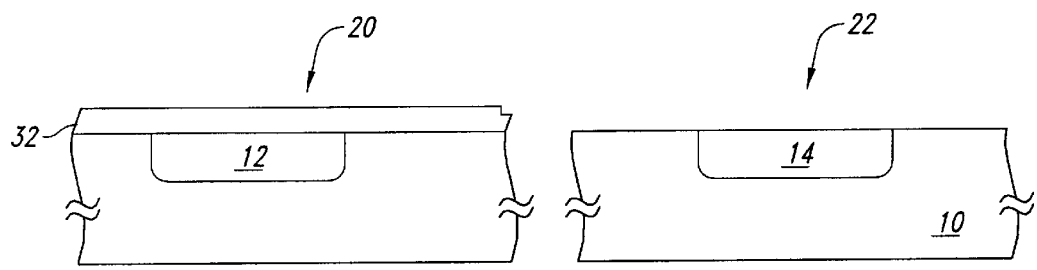
FIGS. 6 and 7 illustrate a method for forming an integrated device according to a third embodiment of the invention.
Figure 7:
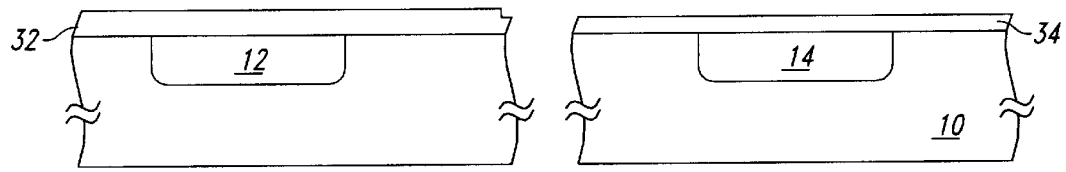

Referring to FIGS. 6 and 7, in order to improve the quality of the dielectric 30 (FIGS. 3–5), another embodiment of the invention involves completely removing the nitrided oxide layer 30 that is formed on the section 22, and subjecting the substrate 10 to another normal high-temperature oxidation to form a layer 34 of silicon dioxide. It was predicted and subsequently found that this latter oxidation did not affect the desired qualities of the dielectric 32 on the section 20 of the substrate 10. It was also unexpectedly found that this latter oxidation did not provide the dielectric 34 having the desired qualities. The explanation for this result is still under investigation. It is clear, however, that the nitriding treatment produces on the oxidized surface of the substrate 10 undesirable effects that remain even after the layer 30 of nitrided oxide has been removed and the layer 34 has been subsequently formed.

Figure 8:
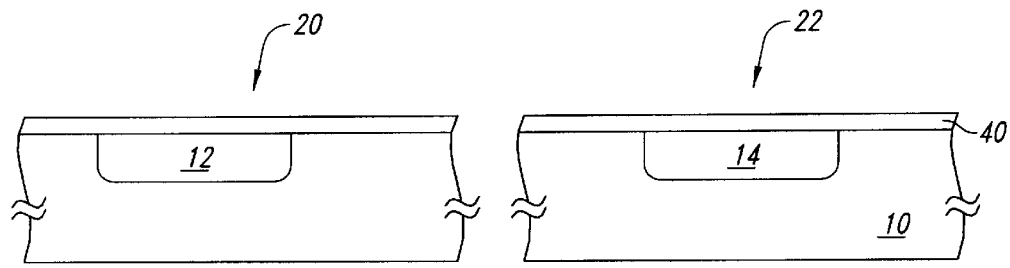
FIGS. 8–11 illustrate a method for forming an integrated device according to a fourth embodiment of the invention.

FIGS. 8–11 illustrate an important variant of the inventive methods described above. Referring to FIG. 8, both sections 20 and 22 of the substrate 10 are first oxidized and nitrided as described above in conjunction with FIGS. 1 and 2 to form a dielectric layer 40.

Figure 9:
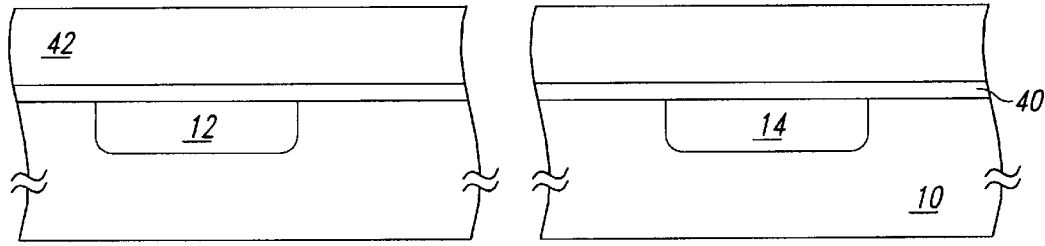

Referring to FIG. 9, a conductive material such as polysilicon is conventionally deposited or otherwise formed on the layer 40 to form a conductive layer 42.

Figure 10:
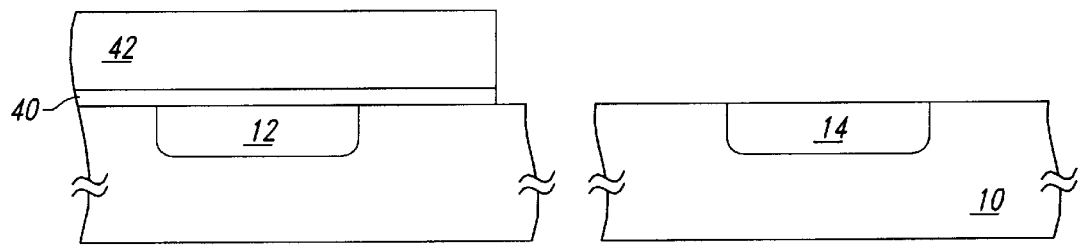

Referring to FIG. 10, the portions of the layers 40 and 42 that are on the section 22 of the substrate 10 are removed, preferably by chemical etching.

Figure 11:
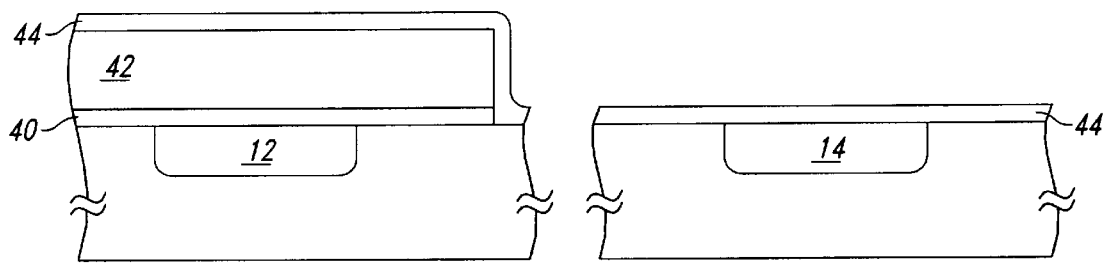

Referring to FIG. 11, the substrate 10 is then subject to another oxidation and nitriding treatment as described above in conjunction with FIGS. 1 and 2 to form a dielectric layer 44 that covers the surface of the substrate 10 in the section 22 and covers the remaining portion of the conductive layer 42. Thus, not only is it possible to produce oxide layers of different thicknesses for the memory cells and the peripheral circuit components such as transistors, but it is also possible to produce for the peripheral components a dielectric having a quality comparable with that of conventional non-nitrided thermal oxides. That is, this process allows the production of not only memory cells of optimal quality, but also peripheral transistors, capacitors and other components that have characteristics that are similar if not identical to the characteristics of similar components that are formed by a conventional process. In fact, it has been discovered that the dielectric layer 44 of the peripheral circuit components has a greater resistance to the "stress" due to the injection of hot electrons than conventional dielectrics.

FIGS. 12–20 illustrate another embodiment of the invention that is suitable to form an integrated circuit that includes nonvolatile, programmable and erasable memory, and peripheral circuits for controlling the memory. In one aspect of the invention, the formed integrated circuit is a "flash" memory.

Figure 12:
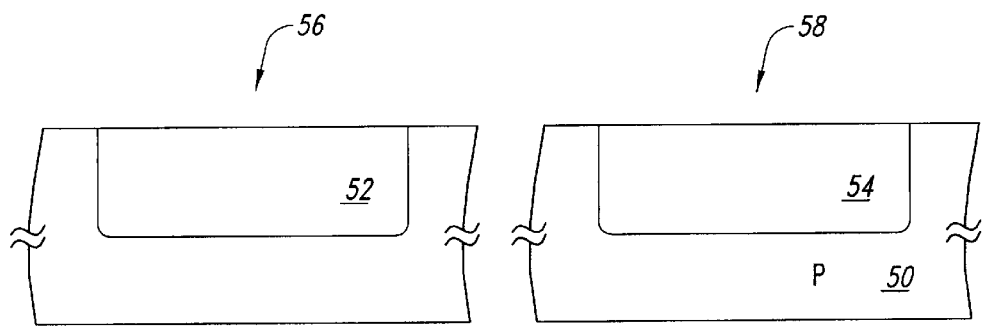
FIGS. 12–20 illustrate a method for forming an integrated device according to a fifth embodiment of the invention.

Referring to FIG. 12, an N region or well 52 is formed in a first section 56 of a p-type substrate 50, and a p-type region or tub 54 is formed in a second section 58 of the substrate 50. Later in the process, the nonvolatile memory cells will be formed in the n-well 52 and the peripheral circuits will be formed in the p-tub 54. The substrate 50 and the regions 52 and 54 are formed in a conventional manner.

Figure 13:
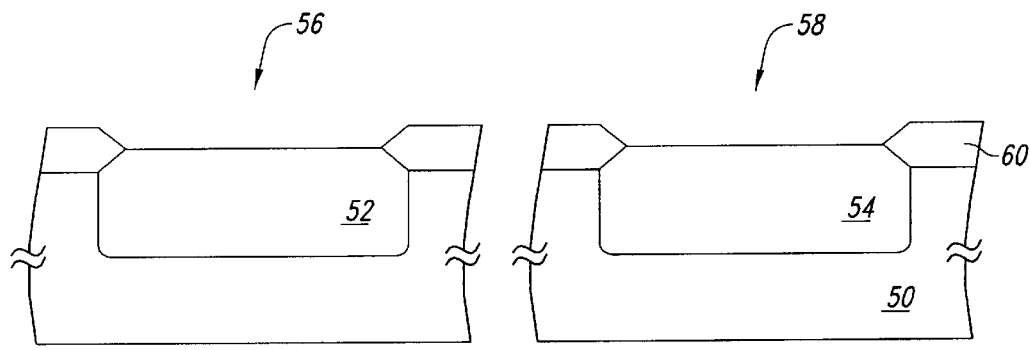

Referring to FIG. 13, regions 60 of field oxide are formed in a conventional manner to isolate the sections 56 and 58 from one another, and to also isolate from one another the active areas formed within each of these sections. After the formation of the field oxide 60, the exposed areas of the substrate 50, i.e., the regions 52 and 54, are thermally oxidized to form an oxide layer (not shown). This oxide layer is then removed in a conventional manner to re-establish the crystalline surface characteristics of the regions 52 and 54.

Figure 14:
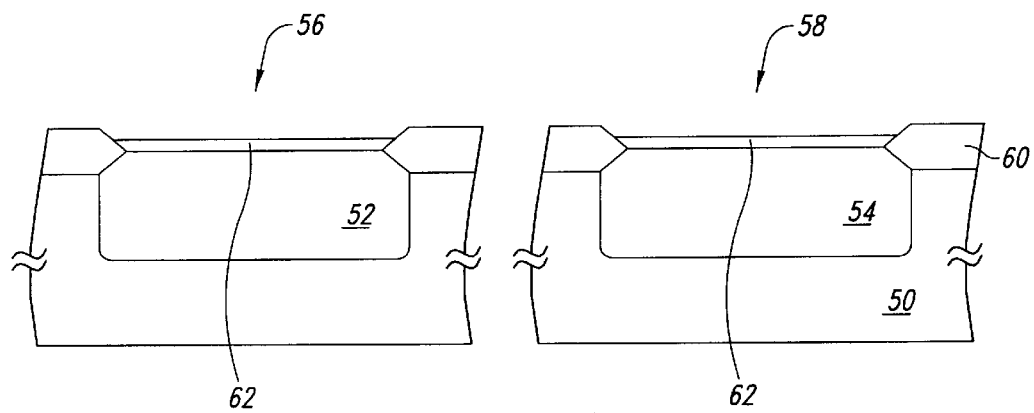

Referring to FIG. 14, a thermal oxide is formed and then exposed to a nitride treatment as discussed above in conjunction with FIGS. 1 and 2 to form a dielectric layer 62.

Figure 15:
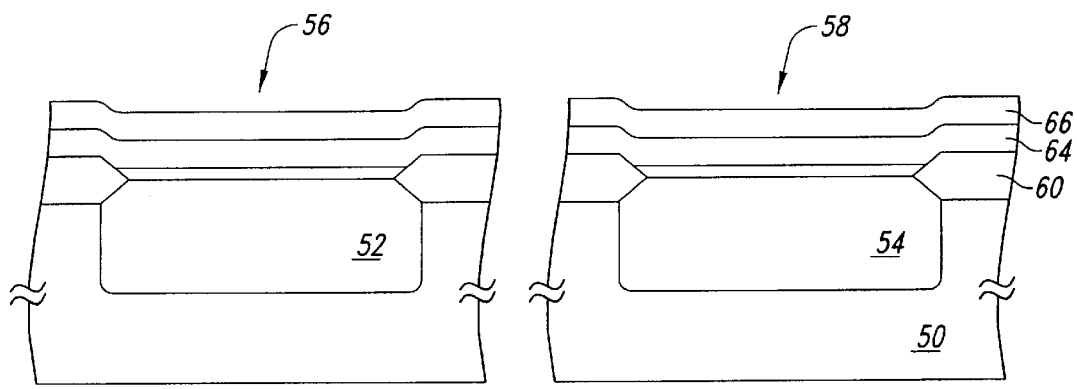

Referring to FIG. 15, a conductive layer 64, such as polycrystalline silicon, is deposited or otherwise formed in a conventional manner on the exposed areas of the dielectric 62 and the field oxide region 60. The portion of conductive layer 64 that is on the region 52 will form the floating gates of the nonvolatile memory cells. Next, a dielectric or interpoly layer 66 is formed on the conductive layer 64. The layer 66 may be formed solely from silicon dioxide or from a number of layers that comprise silicon dioxide and silicon nitride in a conventional manner.

Figure 16:
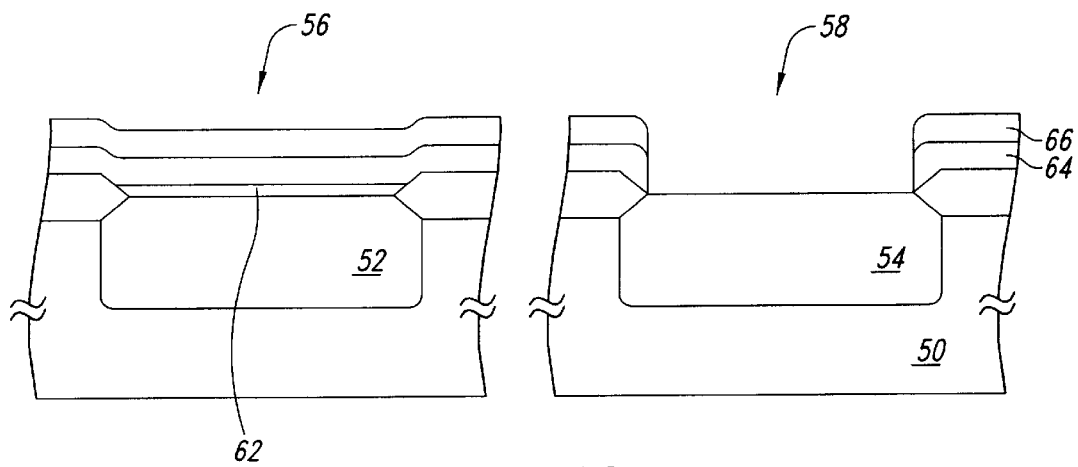

Referring to FIG. 16, the portions of the layers 62, 64, and 66 that are on the region 54 are removed in a conventional manner to expose the region 54.

Figure 17:
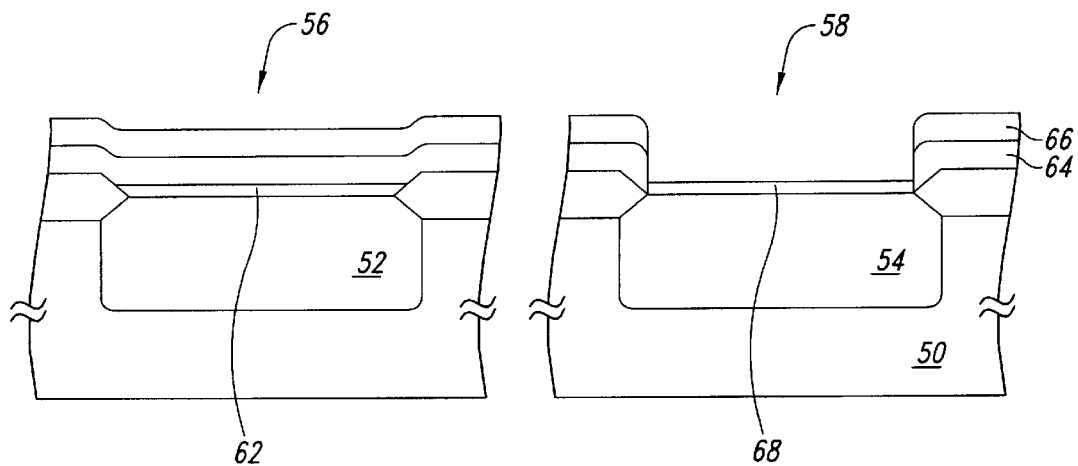

Referring to FIG. 17, a layer of thermal oxide is formed and then exposed to a nitride treatment to form a dielectric layer 68. In one aspect of the invention, the thermal oxide may be formed in multiple steps that include an intermediate step of completely removing an intermediate oxide layer from the region 54 and forming another oxide region before performing the nitride treatment.

Figure 18:
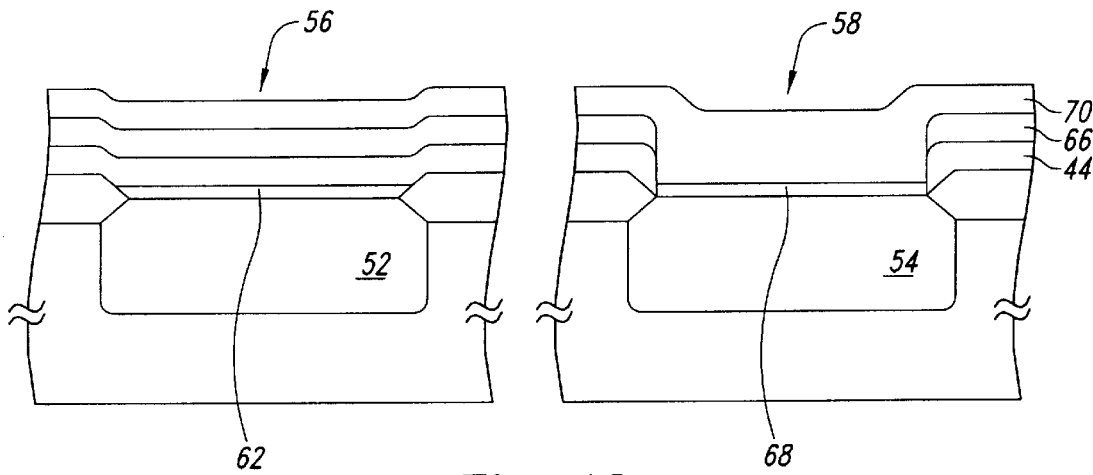

Referring to FIG. 18, a conductive layer 70 is formed on the exposed portions of the dielectric layers 66 and 68. In one aspect of the invention, the layer 70 includes a layer of polycrystalline silicon and a layer of a metallic silicide.

Figure 19:
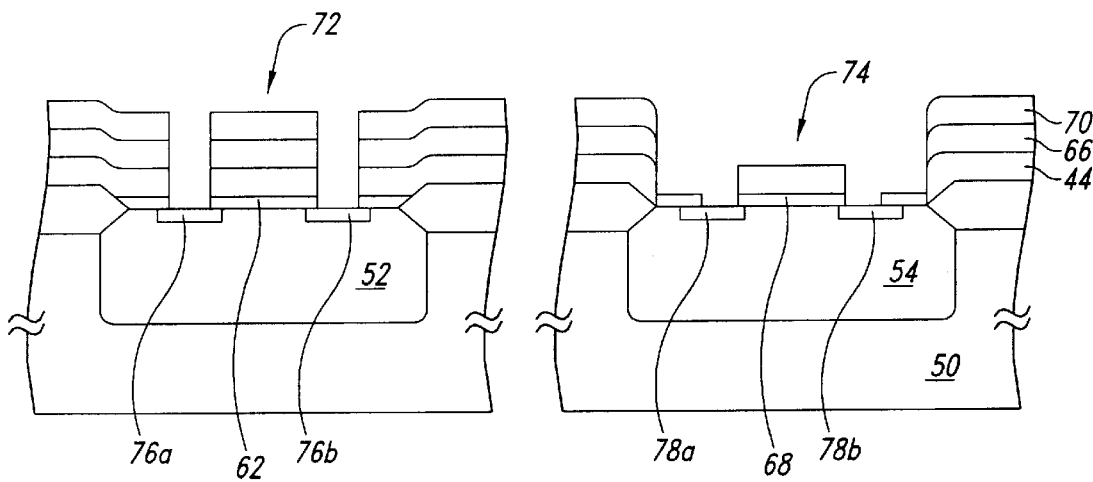

Referring to FIG. 19, appropriate portions of the layers 62, 64, 66, 68, and 70 are removed in a conventional manner to define the gate structures 72 of the non-volatile memory cells and the gate structures 74 of the peripheral transistors. In one embodiment of the invention, the peripheral transistors are MOS-type transistors, and the source and drain regions 76a and 76b of the memory cells and the source and drain regions 78a and 78b of the peripheral transistors are doped in a conventional manner.

Figure 20:
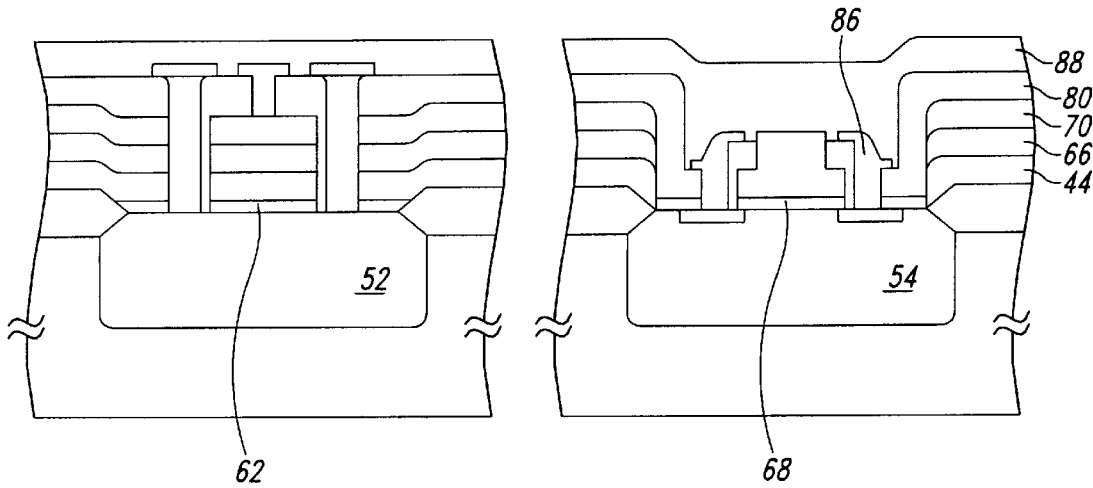

Referring to FIG. 20, a dielectric layer 80 is deposited or otherwise formed in a conventional manner over the exposed portions of the substrate 10 and the layers formed thereon. Windows are opened or formed in the layer 80 to expose the regions 76a, 76b, 78a and 78b, respectively. Furthermore, other openings are formed to expose portions of the gate structures 72 and 74. A conductive layer such as metal is deposited or otherwise formed in a conventional manner to provide electrical contact to the exposed source and drain regions 76a, 76b, 78a, and 78b and the exposed gate structures 72 and 74. Other required circuit interconnections are formed in the conductive layer 86. Next, a dielectric passivation layer 88 is deposited or otherwise formed in a conventional manner on the exposed regions of the substrate 10 and the layers formed thereon.

Referring again to FIGS. 15–17, in another embodiment of the invention, the conductive layer 64 is formed as shown in FIG. 15. Then, as shown in FIG. 16, the conductive layer 64 is removed from the region 54. Next, the interpoly layer 66 and the dielectric layer 68 are formed during the same process step.

Other types of integrated circuits may be formed according to the inventive methods described above. For example, the inventive methods are suitable for forming dynamic random access memories (DRAMs) that have peripheral circuits such as read and write circuits. Referring to FIGS. 12–20, the described process may be modified to form a DRAM device. Specifically, the steps for forming the interpoly dielectric 66 are omitted, and the conductive layer 70 (FIG. 18), which in one embodiment of the invention is formed from polycrystalline silicon and metallic silicide, provides the gate electrodes for both the peripheral transistors and the DRAM memory cells.

Moreover, the inventive methods may also be used for the manufacture of other MOS-type integrated circuits, even those that do not contain memory cells. The inventive methods are particularly suitable for integrated devices that have components that require the two types of dielectric that may be obtained by these methods.

From the foregoing it will be appreciated that, although specific embodiments of the invention have been described herein for purposes of illustration, various modifications may be made without deviating from the spirit and scope of the invention. For example, although the methods describe the removal of the various thermal oxide layers using a chemical etching in a wet solution, a dry method such as reactive ion etching (RIE) may be used. Furthermore, the nitriding treatment may be carried out in an atmosphere that contains nitrogen compounds other than nitrous oxide. For example, the nitriding atmospheres may include NO or $NH_3$, either alone or mixed with other gases such as Ar. Moreover, both the thin-oxide-forming process and the nitriding process, or the nitriding process alone, may be carried out in rapid thermal process (RPT) ovens. Accordingly, the invention is not limited except as by the appended claims.

What is claimed is:

1. A method for forming an integrated device, comprising:

forming in a first section of a substrate having a first conductivity a first region having a second conductivity;

forming in a second section of said substrate a second region having said first conductivity;

forming a first oxide layer on said substrate;

treating said first oxide layer with a nitride;

forming a first conductive layer on said first nitrided oxide layer;

forming a dielectric layer on said first conductive layer;

removing portions of said dielectric, conductive, and nitrided oxide layers that are on said second section of said substrate;

forming a second oxide layer on said second section of said substrate after said removing portions of said dielectric, conductive, and nitrided oxide layers;

treating said second oxide layer with a nitride;

forming a second conductive layer on said second nitrided oxide layer and on a remaining portion of said dielectric layer; and forming nonvolatile memory cells in said first section of said substrate and forming peripheral transistors in said second section of said substrate.

2. The method of claim 1 wherein said first conductivity is p-type and said second conductivity is n-type.

3. The method of claim 1 wherein said forming a second conductive layer comprises:

forming a layer of polysilicon on said second nitrided oxide layer and on said remaining portion of said dielectric layer; and forming a layer of silicide on said layer of polysilicon.

4. A method for forming an integrated device, comprising:

forming in a first section of a substrate having a first conductivity a first region having a second conductivity;

forming in a second section of said substrate a second region having said first conductivity;

forming a first oxide layer on said substrate;

treating said first oxide layer with a nitride;

forming a first conductive layer on said first nitrided oxide layer;

removing portions of said conductive and nitrided oxide layers that are on said second section of said substrate;

forming, after said removing portions of said conductive and nitrided oxide layers, a second oxide layer on said second section of said substrate and on a remaining portion of said first conductive layer;

treating said second oxide layer with a nitride;

forming a second conductive layer on said second nitrided oxide layer; and forming nonvolatile memory cells in said first section of said substrate and forming peripheral transistors in said second section of said substrate.

5. The method of claim 4 wherein said forming a first conductive layer comprises forming a polysilicon layer.

6. The method of claim 4 wherein said forming memory cells and transistors comprises:
- forming floating gates of said memory cells in said first conductive layer;
- forming control gates of said memory cells in said second conductive layer; and
- forming gates of said transistors in said second conductive layer.

7. A method for forming an integrated device, comprising:
- forming in a first section of a substrate having a first conductivity a first region having a second conductivity;
- forming in a second section of said substrate a second region having said first conductivity;
- forming a first oxide layer on said substrate;
- treating said first oxide layer with a nitride;
- removing a portion of said first nitrided oxide layer that is on said second section of said substrate;
- forming a second oxide layer on said second section of said substrate layer after said removing;
- treating said second oxide layer with a nitride;
- forming a conductive layer on said first and second nitrided oxide layers; and
- forming memory cells in said first section of said substrate and forming peripheral transistors in said second section of said substrate.

8. The method of claim 7 wherein said forming memory cells and transistors comprises forming gate electrodes of said memory cells and said transistors in said conductive layer.

9. A method of forming structural elements, each comprising a dielectric and an electrically-conductive element thereon, in manufacturing an integrated circuit with memory cells and peripheral circuits on a monocrystalline silicon die, the memory cells and peripheral circuits having structural elements with dielectrics of different characteristics in contact with the silicon die, the method including formation of first and second dielectrics having thermal oxidation treatments to form silicon dioxide on areas of the die intended for the memory cells and peripheral circuits and for the formation of electrically-conductive material on the first and second dielectrics, the formation of the first and second dielectrics comprising:
- a first oxidation step comprising at least one thermal oxidation treatment;
- a nitriding step;
- a step for the removal of the silicon dioxide from the areas intended for the peripheral circuits;
- a reoxidation step comprising at least one thermal oxidation treatment; and
- a further nitriding step.

10. The method according to claim 9 in which the formation of electrically-conductive material comprises a step for the deposition of polycrystalline silicon before the removal step, the method further comprising a step, before the latter removal, for the removal of the polycrystalline silicon at least from the areas intended for the peripheral circuits, and in which the formation of electrically-conductive material comprises a further step for the deposition of polycrystalline silicon followed by a step for the selective removal thereof to form electrically-conductive elements on the areas intended for the memory cells and peripheral circuits.

11. The method according to claim 10 in which the step for the selective removal of the polycrystalline silicon also comprises the formation of electrically-conductive elements on the areas intended for the memory cells and peripheral circuits.

12. The method according to claim 9 in which the nitriding is carried out in an atmosphere containing nitrous oxide ($N_2O$) at a temperature of between 750 and 1050° C.

* * * * *